(12) United States Patent
Makara

(10) Patent No.: US 7,286,219 B2
(45) Date of Patent: Oct. 23, 2007

(54) EXPOSURE SYSTEM, SEMICONDUCTOR DEVICE, AND METHOD FOR FABRICATING THE SEMICONDUCTOR DEVICE

(75) Inventor: Reiji Makara, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 98 days.

(21) Appl. No.: 11/215,246

(22) Filed: Aug. 30, 2005

(65) Prior Publication Data
US 2006/0043460 A1    Mar. 2, 2006

Related U.S. Application Data

(63) Continuation of application No. PCT/JP2004/012477, filed on Aug. 30, 2004.

(51) Int. Cl.
G01N 21/00    (2006.01)
G03B 27/64    (2006.01)
G03F 9/00     (2006.01)
G03C 5/00     (2006.01)

(52) U.S. Cl. ................. 356/237.4; 356/237.3; 356/237.5; 355/77; 430/22; 430/30

(58) Field of Classification Search .............. None
See application file for complete search history.

(56) References Cited

U.S. PATENT DOCUMENTS 6,559,662 B1 *   5/2003   Yamada et al. ............. 324/751
6,800,421 B2    10/2004   Hasegawa et al. .......... 430/311
7,116,816 B2 *  10/2006   Tanaka et al. .............. 382/149

FOREIGN PATENT DOCUMENTS

| JP | 3-89511     | 4/1991  |
| JP | 2-178968    | 7/1997  |
| JP | 11-297595   | 10/1999 |
| JP | 2000-292810 | 10/2000 |
| JP | 2002-124447 | 4/2002  |
| JP | 2000-184669 | 6/2002  |

* cited by examiner

Primary Examiner—Gregory J. Toatley, Jr.
Assistant Examiner—Gordon J. Stock, Jr.

(57) ABSTRACT

In order to link a defect inspection process before forming contact holes with an exposure process for forming the contact holes, a position (physical coordinates) of a defect on a wafer is stored, the defect having been detected in the defect inspection process before forming the contact holes, an exposure (dummy exposure) is performed under the condition that no contact hole is formed on the above-mentioned position. In this method, no contact hole is formed in the region having the defect therein, the cell is considered as a defective one, yet a word line (control gate) and a bit line are not short-circuited through the contact hole, and makes it possible to avoid the short-circuiting by only applying a redundancy to the bit line as conventionally employed.

7 Claims, 6 Drawing Sheets

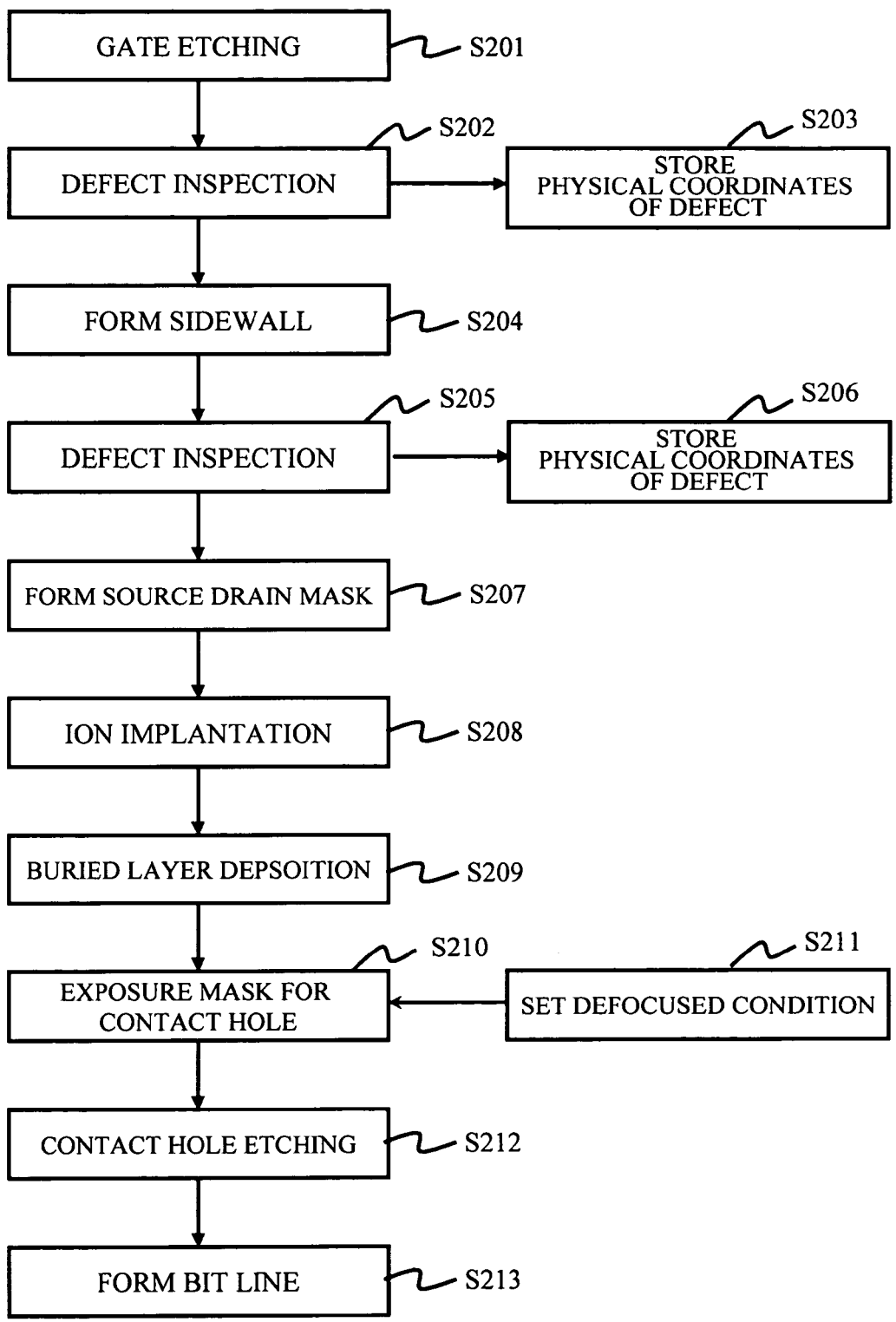

EXPOSURE SYSTEM, SEMICONDUCTOR DEVICE, AND METHOD FOR FABRICATING THE SEMICONDUCTOR DEVICE

CROSS REFERENCE TO RELATED APPLICATIONS

This is a continuation of International Application No. PCT/JP2004/012477, filed Aug. 30, 2004.

BACKGROUND OF THE INVENTION

1. Field of the Invention

This invention generally relates to semiconductor devices and methods for fabricating thereof, and more particularly, to a fabricating technique of a non-volatile semiconductor memory device that has improved redundant efficiency of a flash memory of a NOR type.

2. Description of the Related Art

A flash memory, which is a non-volatile semiconductor memory device, has both features of a RAM (Random Access Memory) on which data is rewritable and ROM (Read Only Memory) on which the data is retainable after the power is off. Generally, a smallest memory unit in a memory device is known as cell, and one cell stores one bit. SRAM or DRAM is composed of a single cell made of multiple elements. On the other hand, a single cell in the flash memory is composed of only one transistor, which is a smallest number of the elements. Therefore, it is possible to reduce the cost. The aforementioned single cells are grouped into one sector (block), and a memory region is formed by assembling the aforementioned sectors. Data erase is performed in the memory region on a sector basis (on a chip basis).

The flash memory is categorized into a NAND type and a NOR type. A flash memory of the NAND type includes one data line directly connected by 8-bit or 16-bit of the memory cell, and employs Fowler-Nordheim tunnel effect with the use of whole surfaces of a silicon substrate and a floating gate in both writing and erasing. In contrast, the flash memory of the NOR type includes memory cells respectively connected in parallel to one data line, and utilizes a hot electron in writing and the Fowler-Nordheim tunnel effect in erasing.

FIG. 1 is a schematic cross-sectional view illustrating a connection between the cell in the flash memory of the NOR type and the bit line. A flash memory cell of the NOR type 10 is formed of a semiconductor substrate 11, a floating gate 12, a word line 13, a contact portion 14 (composed of contact holes and conductive members therein), an insulator layer 17, and a bit line 15. The floating gate 12 and the word line 13 are formed inside the insulator layer 17 provided on the semiconductor substrate 11. The contact portion 14 is provided in the insulator layer 17. The bit line 15 establishes contact with the semiconductor substrate 11 (specifically, contact with an impurity diffused layer) through the contact portion 14. With respect to each cell 10 in the flash memory of the NOR type, whether or not the information is stored can be determined by storing an electron in the floating gate 12, the electron having been injected by applying voltage from the word line 13.

In a fabricating process of the cell having the above-mentioned structure, possibly there arises a problem in operation caused resulting from an electric short circuit between the word line 13 and the contact portion 14 due to a defect 16. However, even if a redundancy is applied to the bit line in the problem in operation, the word line 13 still short-circuits the contact portion 14 connected to the bit line 15 to which the redundancy is applied. This prevents the word line 13 from being supplied with sufficient voltage at the time of writing, reading, and erasing the data, and the problem in operation cannot be solved.

This time, even if the redundancy is applied to the word line, only erase operation is performed, yet write operation is not performed on the cell provided on the redundant word line 13 and connected to an irredundant bit line 15. This results in an affect in reading other cells connected to the same bit line 15, because a threshold voltage of the aforementioned cell becomes negative.

FIG. 2 is a view illustrating a circuit configuration of the flash memory of the NOR type. As shown in this figure, one memory cell 10 is connected between the word line 13 and the bit line 15. Any one of the memory cells 10 is conductive, the potential of the bit line 15 decreases.

In FIG. 2, assuming that there is an electric short-circuit between a word line 13-1 and a contact hole provided on a cell 10-1, which is located on an intersection of the word line 13-1 and a bit line 15-1, and then the redundancy is applied to the word line 13-1 and the bit line 15-1 to fix the short-circuiting. The flash memory of the NOR type is erased on a sector (memory block) basis, and accordingly, the erase operation is performed on not only the cell 10-1 but also other cells connected to the redundant word line 13-1 and the redundant bit line 15-1 simultaneously. On the other hand, the write operation is performed on the word line and the bit line selected, the cells connected to the redundant word line 13-1 and the redundant bit line 15-1 cannot be selected and the write operation cannot be performed. Even if the cells connected to the redundant word line 13-1 and the redundant bit line 15-1 can be selected, the sufficient voltage cannot be supplied to the word line and the write operation cannot be performed.

The threshold voltage of the cell, in which only the erase operation is performed and the write operation is not performed, gradually decreases and becomes negative, and then the cell lets a current flow through in a state of the gate voltage of 0 V. On the flash memory of the NOR type, the current flowing through the bit line is detected as a cell current, yet the currents of the cells connected to irredundant bit lines (15-0,15-2, and 15-3) are affected by the cell currents connected to the redundant word line 13-1. This makes it impossible to read the selected cell current properly.

As described above, the redundancy cannot be applied to the problem in operation induced by the electric short-circuit between the word line 13 and the contact portion 14, and the problem cannot be solved.

SUMMARY OF THE INVENTION

The present invention has been made in view of the above circumstances and has objects of providing a method for fabricating a non-volatile semiconductor memory device that can solve a problem in operation caused resulting from a defect located between a word line and a contact hole only with the use of redundancy of a bit line, and thereby improving a yield ratio of manufacturing.

According to an aspect of the present invention, preferably, there is provided an exposure system including inspection equipment that detects a defect on a semiconductor wafer, a controller that stores physical coordinates of the defect on the semiconductor wafer, and an exposure device that exposes the semiconductor wafer under an exposure condition controlled by the controller so that no contact hole is formed in a region corresponding to the physical coordinates of the defect. On the aforementioned exposure system, the exposure device may expose the region under a defocused condition or irradiates no beam onto the region. On the aforementioned exposure system, the exposure device is an electron beam exposure device of a scanner type.

According to another aspect of the present invention, preferably, there is provided a method of fabricating a semiconductor device comprising the steps of detecting a defect on a semiconductor wafer in advance of forming contact holes, storing physical coordinates of the defect detected, exposing the semiconductor wafer to form the contact holes so that no contact hole is formed in a region corresponding to the physical coordinates of the defect. The aforementioned step of exposing may expose the semiconductor wafer under a defocused condition or irradiates no beam onto the region. The aforementioned step of exposing forms the contact holes so as to make a memory cell arrangement of a NOR type. Preferably, the above-mentioned method may further include a step of replacing a bit line that includes the region having the defect with a redundant bit line.

According to another aspect of the present invention, preferably, there is provided a semiconductor device including a semiconductor substrate, an insulator layer formed on the semiconductor substrate, bit lines formed on the insulator layer, contact holes that are formed in the insulator layer between the bit lines and the semiconductor substrate, and floating gates and word lines formed within the insulator layer. The semiconductor device having a regular arrangement of contact holes which arrangement may include a position at which no contact hole is formed. On the aforementioned semiconductor device, the bit lines may include a redundant bit line located at the position at which no contact hole is formed.

According to the present invention, no contact hole is formed in the region in which there is a defect, and the cell is considered as a defective one. Accordingly, the word line (the control gate) and the bit line is not short-circuited through the contact hole, and it is possible to avoid short-circuiting, by applying a redundancy on the bit line as conventionally employed.

BRIEF DESCRIPTION OF THE DRAWINGS

FIG. 4 is a flowchart exemplifying a part of a sequence of processes starting from the above-mentioned defect inspection process through an exposure process;

DESCRIPTION OF THE PREFERRED EMBODIMENTS

A bottom cause of the above-mentioned problem in operation comes from a defect (for example, a particle adhered on a wafer (semiconductor substrate)) occurred in a manufacturing process of the non-volatile semiconductor memory device, and the defect becomes a problem in forming normal contact holes in a consequent process. The electric short-circuit between the contact hole and the word line makes it impossible to apply the redundancy. However, the aforementioned defect can be detected by a defect inspection in advance of a process of forming the contact holes. If there is no contact hole formed on a position of the defect, the word line and the bit line are not short-circuited through the contact hole. It is therefore possible to avoid short-circuiting by applying the redundancy on the bit line as conventionally employed. In other words, by replacing "a defect of the particle" with "a defect with no contact hole", the conventional redundant method is applicable and the problem in operation can be solved.

On this account, in the present invention, a defect inspection process before forming the contact holes is linked with an exposure process for forming the contact holes. Specifically, a position (physical coordinates) of the defect on a wafer, which has been detected in the defect inspection process before forming the contact holes, is stored, and an exposure (dummy exposure) is performed so that no contact hole is formed on the aforementioned position. Here, the dummy exposure denotes, for example, the exposure under a defocused condition of avoiding forming the contact hole, or an "empty exposure" that does not expose (does not irradiate no beam onto) the region. The dummy exposure will be described as the exposure under the defocused condition for simplification; however, the present invention is not limited to the exposure under the defocused condition. As described, there is no contact hole formed on the position (physical coordinates) of the defect on the wafer that has been detected in the defect inspection process before forming the contact holes, in accordance with the present invention.

The position of the defect can specified by a pattern recognition that compares images of adjacent circuit patterns, and in addition, not only the physical coordinates of the defect but also a spatial spread (size) thereof can be measured at the time of the pattern recognition. Also, an exposure device embodying the present invention is a "scanner type" (for example, an EB exposure device), which can set exposure conditions according to every contact hole. If there is a defect in a region in which a contact hole is formed, the defocused exposure condition is intentionally configured to perform the dummy exposure instead of a substantial exposure.

A description will now be given, with reference to the accompanying drawings, of embodiments of the present invention.

Figure 3:
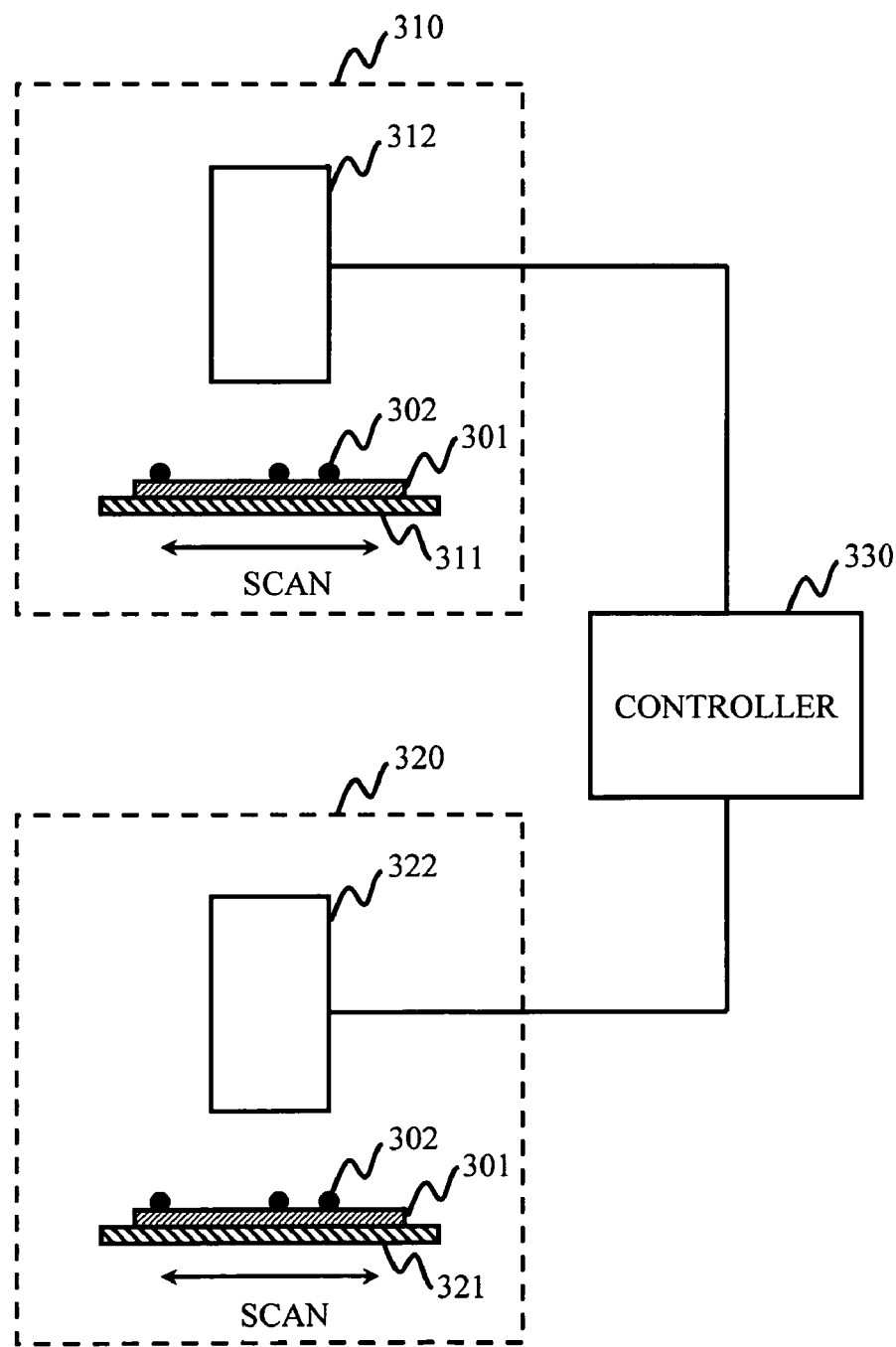
FIG. 3 is a block diagram of an exposure system illustrating a linkage between a defect inspection equipment inspecting the defect before forming contact holes and an exposure device of a scanner type exposing for forming the contact holes.

FIG. 3 is a block diagram of an exposure system illustrating a linkage between a defect inspection equipment inspecting the defect before forming the contact holes and an exposure device of a scanner type exposing for forming the contact holes. In FIG. 3, a reference numeral 310 represents a surface inspection equipment and a reference numeral 320 represents an exposure device of a scanner type, both of which includes stages 311 and 321 to mount a wafer 301 thereon. Information on the physical coordinates of a defect (for example, a particle) 302, which has been detected on the wafer 301 in the defect inspection with the surface inspection equipment 310 before forming the contact holes, is transmitted to and stored in a controller (for example, a personal computer) 330. The aforementioned surface inspection is carried out by a general method. For example, laser beams are entered obliquely into the surface of the wafer 301, scattered beams are monitored with a detecting portion 312, and the pattern of the image is analyzed according to signals. In addition, the size of the defect is obtainable by analyzing the strength of the scattered beams, in the image analysis.

The exposure has been performed in order to form the contact holes on the wafer that has completed the surface inspection. As described above, if the contact hole is formed on a coordinate position of the defect 302 on the wafer 301, the problem cannot be solved only by the redundant bit line. Therefore, the controller 330 transmits a signal of setting the defocused exposure condition to an exposure portion 322 when the exposure is performed in a region on the wafer 301 corresponding to the defect 302 with the use of the exposure device 320. In addition, as described above, another signal is transmitted to the exposure portion 322, indicating that the region on the wafer 301 corresponding to the defect 302 is not exposed.

FIG. 4 a flowchart exemplifying a part of a sequence of processes starting from the above-mentioned defect inspection process through the exposure process. FIGS. 5A through 5D are views illustrating component parts of a transistor formed by the processes in the flowchart shown in FIG. 4.

After a second gate etching process (step S201) is completed, the wafer is inspected whether or not there is a defect thereon with the defect inspection equipment (step S202). If the defects are detected, the information on the physical coordinates corresponding to the positions of the respective defects are transmitted to and stored in the controller (step S203). Then, a deposition is performed to form sidewalls (step S204). After this process, the defect inspection is performed same as described above (step S205), and the controller stores the result (step S206).

Figure 5A:
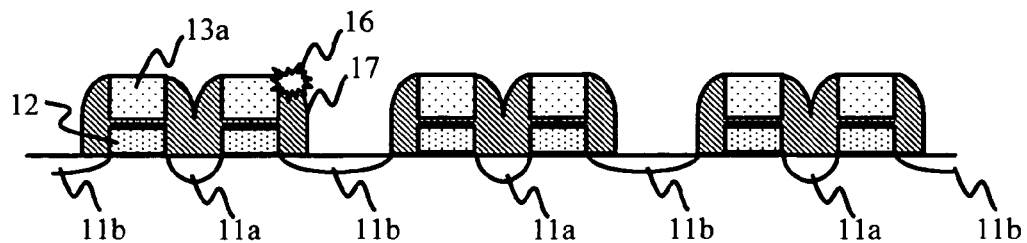
FIG. 5A is a first view illustrating component parts of a transistor to be formed in the process in the flowchart shown in FIG. 4.

For example, as shown in FIG. 5A, the floating gate 12 and a control gate 13a are provided on the surface of the substrate 11 having a source 11a and a drain 11b formed thereon. Sidewalls 17 are provided on the sides of the gates. Originally, the contact holes are formed in between the sidewalls 17 on the gate sides. However, if there is the defect 16 in the corresponding region, it is necessary not to form the contact hole in the aforementioned region. Therefore, the information on the physical coordinates that has been detected in the step S205 is transmitted to and stored in the controller (step S206), and then is used as the position that should be defocused in a focus adjustment in the subsequent exposure process. As described above, if the "empty exposure" is employed instead of the defocused exposure, the information on the physical coordinates of the defect 16 is used as the position on which the exposure is not performed.

After a mask process for introducing impurities into the source 11a and the drain 11b (step S207) and an ion implantation (step S208), a deposition process is performed to bury the gate (step S209). Then, a photoresist mask is formed on the aforementioned buried layer to form the contact hole (step S210).

Figure 5B:
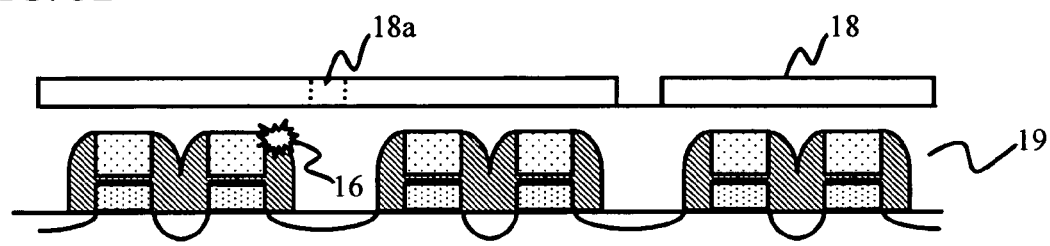
FIG. 5B is a second view illustrating the component parts of the transistor to be formed in the process in the flowchart shown in FIG. 4.
Figure 5C:
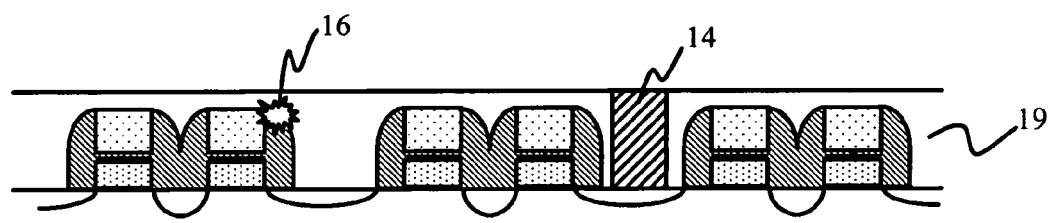
FIG. 5C is a third view illustrating the component parts of the transistor to be formed in the process in the flowchart shown in FIG. 4.

FIG. 5B shows a photoresist mask 18 that has been exposed not to form the contact hole on the position of the defect 16. The photoresist mask 18 is formed by exposing the photoresist evenly applied on the gate buried layer 19 to have an opening only in the region corresponding to the position on which the contact hole is to be formed. A region represented by a reference numeral 18a in FIG. 5B corresponds to the region in which the opening is to be provided for forming the contact hole. However, there is the defect 16 corresponding to the aforementioned position. Therefore, the controller transmits the information on the physical coordinates of the defect to the exposure device not to form the opening on the corresponding position (step S211), and the exposure device performs the dummy exposure so that the contact hole may not be formed on the region having the defect therein under the defocused exposure condition, according to the information.

Figure 5D:
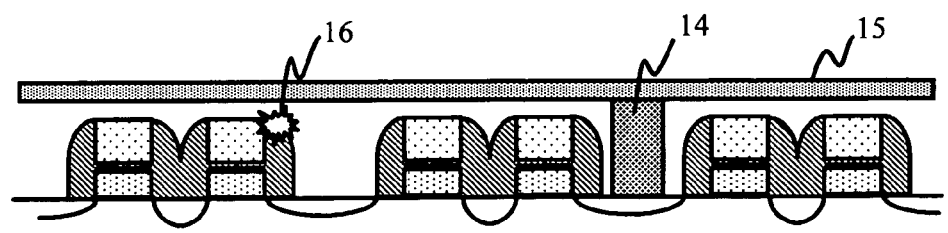
FIG. 5D is a fourth view illustrating the component parts of the transistor to be formed in the process in the flowchart shown in FIG. 4.

Etching is performed for forming the contact holes with the above-mentioned photoresist mask 18 (step S212 and FIG. 5C), and the contact is established to form the bit line 15 (step S213 and FIG. 5D).

Figure 6A:
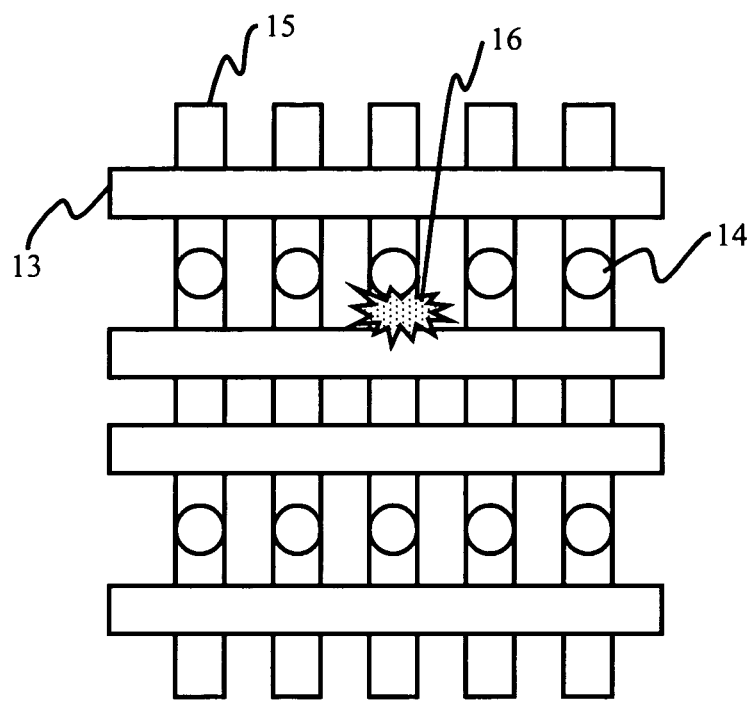
FIG. 6A is a top plan view illustrating how to avoid short-circuiting between the word line and the contact hole without forming the contact hole.
Figure 6B:
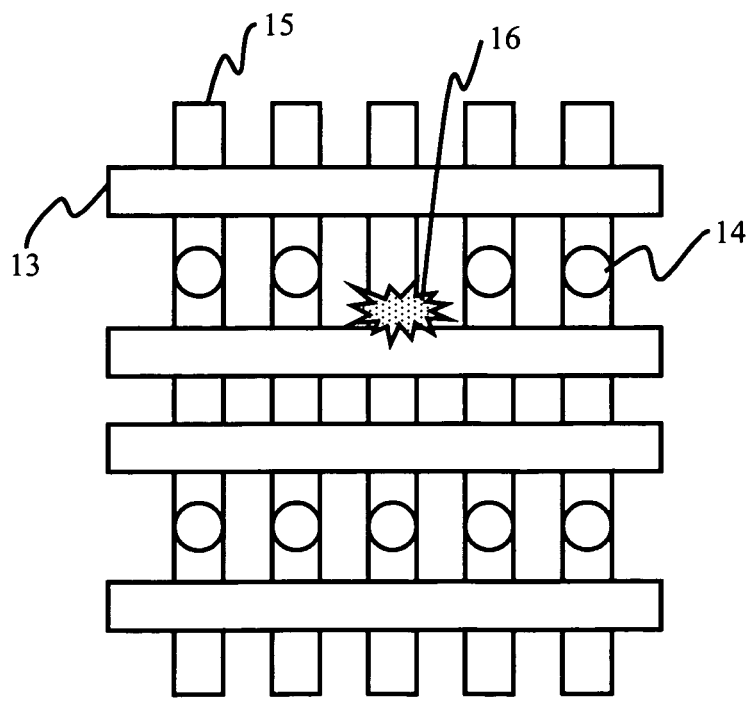
FIG. 6B is a top plan view illustrating how to avoid short-circuiting between the word line and the contact hole without forming the contact hole.

FIGS. 6A and 6B are top plan views illustrating how to avoid short-circuiting between the word line and the contact hole without forming the contact hole. In the conventional method (FIG. 6A) of forming the contact portion 14 regardless of existence of the defect 16, the contact portion 14 formed in the region of the defect 16 short-circuits the word line 13 and the bit line 15, and the problem cannot be solved by only applying the redundancy to the bit line. In contrast, according to the method of the present invention (FIG. 6B), the contact region 14 (more specifically, the contact hole) is not formed in the region of the defect 16. The cell is regarded as a defective one, yet the word line (the control gate 13a) and the bit line 15 are not short-circuited through the contact portion 14. It is therefore possible to solve the problem by only applying the redundancy to the bit line as employed conventionally. In other words, by replacing "a defect of the particle" with "a defect with no contact hole", the conventional redundant method is applicable and the problem in operation can be solved.

Figure 1:
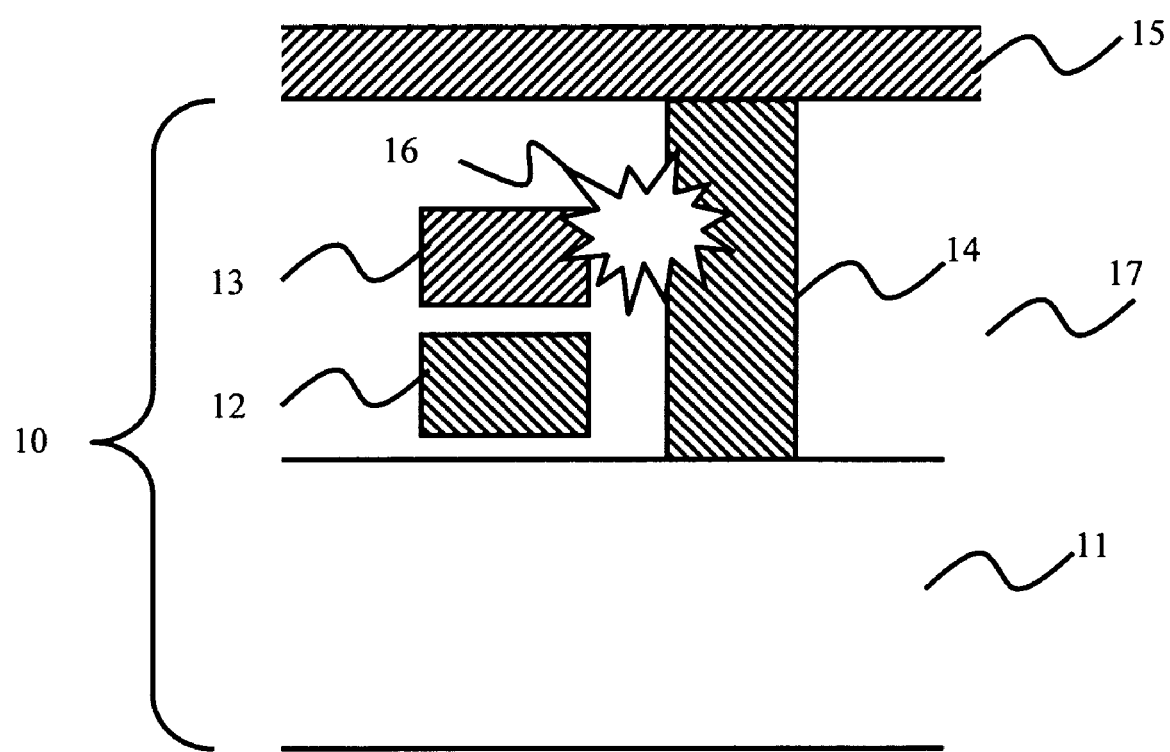
FIG. 1 is a schematic cross-sectional view illustrating a connection between a cell in a flash memory of a NOR type and a bit line.
Figure 2:
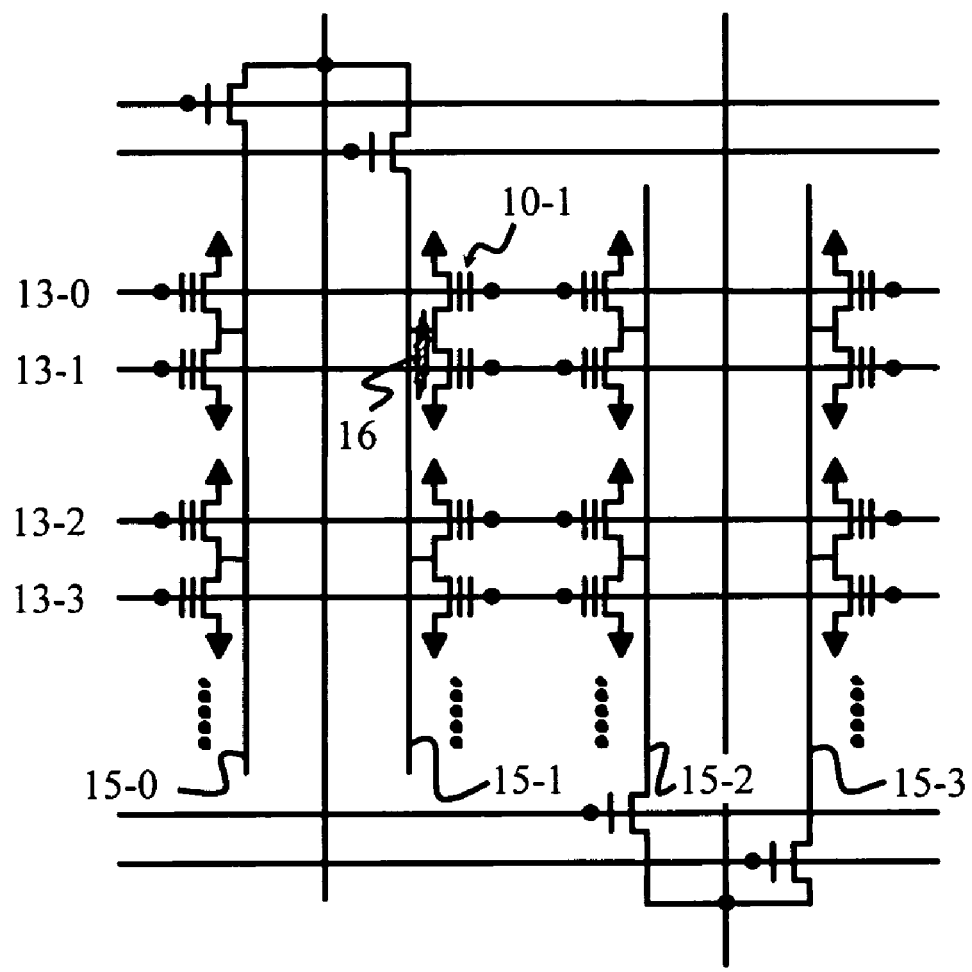
FIG. 2 is a view illustrating a circuit configuration of the flash memory of the NOR type.

A configuration of the flash memory shown in FIG. 6B is described with that shown in FIG. 1. The flash memory includes the semiconductor substrate 11, the insulator layer 17 formed on the semiconductor substrate 11, the bit line 15 formed on the insulator layer 17, the contact portion 14 establishing a contact between the bit line 15 formed inside the insulator 17 and the semiconductor substrate 11, the floating gate 12 formed in the insulator layer 17, and the word line 13. The contact portion 14 has a regular arrangement, and a portion (the portion corresponding to a reference numeral 16), which is irregularly provided in the regular arrangement, is also included. The redundant process is applied to the bit line on which the contact portion is not formed. According to the present invention, only applying the redundancy to the bit line can cope with the problem, and makes it possible to provide the semiconductor device that solves the problem in operation effectively Here, the defect inspection is performed twice, that is, after the second gate etching process and after the sidewall deposition process. However, appropriate number of timed may be provided according to the process design of the device to be manufactured.

The present invention makes it possible to provide a method of fabricating a non-volatile semiconductor memory device in which redundancy effects are improved and provide an exposure system that enables the method.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An exposure system comprising:
    inspection equipment that detects a defect on a semiconductor wafer;
    a controller that stores physical coordinates of the defect on the semiconductor wafer; and
    an exposure device that exposes the semiconductor wafer under an exposure condition controlled by the controller to form contact holes so that no contact hole is formed in a region corresponding to the physical coordinates of the defect.

2. The exposure system as claimed in claim 1, wherein the exposure device is an electron beam exposure device of a scanner type.

3. An exposure system comprising:
    inspection equipment that detects a defect on a semiconductor wafer;
    a controller that stores physical coordinates of the defect on the semiconductor wafer; and
    an exposure device that exposes the semiconductor wafer under an exposure condition controlled by the controller so that no contact hole is formed in a region corresponding to the physical coordinates of the defect, wherein the exposure device exposes the region under a defocused condition or irradiates no beam onto the region.

4. A method of fabricating a semiconductor device comprising the steps of:
    detecting a defect on a semiconductor wafer in advance of forming contact holes;
    storing physical coordinates of the defect detected;
    exposing the semiconductor wafer to form the contact holes so that no contact hole is formed in a region corresponding to the physical coordinates of the defect.

5. The method as claimed in claim 4, further comprising a step of replacing a bit line that includes the region having the defect with a redundant bit line.

6. The method as claimed in claim 4, wherein the step of exposing exposes the semiconductor wafer under a defocused condition or irradiates no beam onto the region.

7. The method as claimed in claim 6, wherein the step of exposing forms the contact holes so as to make a memory cell arrangement of a NOR type.

* * * * *